(12) United States Patent
Saiki et al.

(10) Patent No.: US 7,935,574 B2
(45) Date of Patent: May 3, 2011

(54) MARKING METHOD AND SHEET FOR BOTH PROTECTIVE FILM FORMING AND DICING

(75) Inventors: Naoya Saiki, Koshigaya (JP); Tomonori Shinoda, Saitama (JP); Akie Hamasaki, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 1138 days.

(21) Appl. No.: 11/271,212

(22) Filed: Nov. 10, 2005

(65) Prior Publication Data

US 2006/0102987 A1 May 18, 2006

(30) Foreign Application Priority Data

Nov. 12, 2004 (JP) ................................. 2004-329418

(51) Int. Cl.
*H01L 21/00* (2006.01)

(52) U.S. Cl. ................. 438/113; 438/464; 257/E21.599

(58) Field of Classification Search .................. 438/113, 438/464; 257/E21.599
See application file for complete search history.

(56) References Cited

U.S. PATENT DOCUMENTS

| | | | | |
|---|---|---|---|---|
| 4,753,863 A | * | 6/1988 | Spanjer | 430/138 |
| 6,147,374 A | * | 11/2000 | Tanaka et al. | 257/295 |
| 6,284,185 B1 | * | 9/2001 | Tokuda et al. | 264/494 |
| 6,806,725 B2 | * | 10/2004 | Tsui et al. | 324/755 |
| 6,919,262 B2 | | 7/2005 | Senoo et al. | |
| 2001/0042902 A1 | * | 11/2001 | Wakabayashi et al. | 257/620 |
| 2004/0033375 A1 | * | 2/2004 | Mori | 428/457 |
| 2005/0126686 A1 | * | 6/2005 | Cheong et al. | 156/153 |

FOREIGN PATENT DOCUMENTS

| | | |
|---|---|---|
| JP | 2002-280329 A | 9/2002 |
| JP | 2004-214288 A | 7/2004 |

* cited by examiner

*Primary Examiner* — Walter L Lindsay, Jr.
*Assistant Examiner* — Ron Pompey
(74) *Attorney, Agent, or Firm* — The Webb Law Firm

(57) ABSTRACT

The invention provides a marking method in which marking is performed on a protective film formed on a work with a high accuracy while suppressing a warpage and, also, a sheet for both protective film forming and dicing which is advantageously used in the method. The marking method comprises irradiating laser light to a laminated structure comprising a support film tensely supported by a ring frame, a protective film releasably laminated on the support film and a work fixed to the protective film, wherein the protective film is irradiated laser light from a side of the support film, to thereby mark the protective film.

12 Claims, 3 Drawing Sheets

MARKING METHOD AND SHEET FOR BOTH PROTECTIVE FILM FORMING AND DICING

BACKGROUND OF THE INVENTION

1. Field of the Invention

The present invention relates to a method for forming a protective film and, then, performing marking on the protective film, and a sheet for both protective film forming and dicing which is favorably used in the method.

2. Description of the Prior Art

Recently, production of semiconductor devices is made through a so-called face down mounting process. In the face down process, chips are electrically connected with a substrate through a convex portion called as a bump formed on a circuit surface of the chip to ensure its conductivity to the substrate.

Semiconductor devices are generally produced though the following steps:

(1) forming a circuit on a surface of a wafer by etching or the like and providing a bump on a given position of the circuit surface;

(2) grinding a back surface of the wafer to have a given thickness;

(3) fixing the back surface of the wafer onto a dicing sheet which is tensely supported by a ring frame, and dicing the wafer to separate each circuit by the use of a dicing saw to obtain semiconductor chips; and (4) picking up the semiconductor chips to mount them face down on a given substrate and sealing each chip in a resin or coating the back surface of the chip with a resin for chip protection according to necessity, thereby obtaining a semiconductor device.

Such resin sealing is performed by dripping a resin in a proper amount on the chip (potting method) or using a mold (molding method), both followed by curing. The potting method has a drawback of difficulty in dripping the proper amount of the resin. The molding method involves washing of the mold, which will require additional costs for equipment and operation thereof. Such resin coating may cause uneven quality because of difficulty in spreading a proper amount of resin uniformly on the chip. Therefore, the technique which is capable of forming a highly uniform protective film on the back surface of the chip by a simplified operation has been desired.

In grinding the back surface of the wafer in step (2), minute streaky scratches are formed on the back surface of the chip owing to the use of a grinding machine. The minute scratches may cause cracks during the dicing in the step (3) or after the device is packaged. As such, it has been conventionally required in some cases to perform chemical etching after the mechanical grinding to eliminate the minute scratches. The chemical etching, as a matter of course, raises problems related to the cost increase for its equipment and operation. Therefore, the technique for preventing adverse effects resulting from minute scratches has been desired, even if minute scratches are left on the back surface of the wafer as a result of mechanical grinding.

As a technique for responding to such requirements, JP-A No. 2002-280329 discloses "a sheet for protective film forming for chips having a release sheet and a protective film forming layer which is formed on a release surface of the release sheet and contains a thermosetting component and/or an energy ray-curable component and a binder polymer component". In JP-A No. 2004-214288, it has been described that, further in the invention according to JP-A No. 2002-280329, in order to enhance an adhesion property between a protective film formed by curing an protective film forming layer and a wafer (chip) which is an adherend, a curable adhesion layer is provided on the protective film forming layer.

In a process using the sheet for the protective film forming for chips, the protective film forming layer can be formed on the wafer such that the sheet for forming the protective film for chips is adhered on the wafer and, then, a release sheet is removed. Next, the protective film forming layer on the wafer becomes a protective film by curing with heating or the like and, then, marking of, for example, a product number is performed on the protective film. Thereafter, the wafer having the protective film is fixed on a dicing sheet and, then, dicing and pick-up are performed. As for a marking method, ordinarily, a laser marking method which inscribes a surface of the protective film by irradiating laser light is used.

In the above-described process, there has been a case in which, when the sheet for the protective film forming layer for chips is adhered to the wafer, tension applied to the sheet remains after it is adhered to cause the wafer to have a warpage. Another case in which, when the protective film is cured, the protective film is shrunk to cause the wafer to have a warpage. Still another case in which the wafer itself to be used originally has a warpage.

In the above-described process, when the marking is performed, laser light can not be focused on the wafer having such warpage as described above and, accordingly, the marking having a high accuracy has not been performed.

In light of the above prior art, the present invention has been achieved and has an object to provide, in a process in which marking is performed on a protective film formed on a work such as a wafer, a marking method in which the marking is performed on the protective film with a high accuracy by suppressing a warpage and, also, a sheet for both protective film forming and dicing which is advantageously used in the method.

SUMMARY OF THE INVENTION

The subject matter of the present invention for solving these problems is briefly described below.

(1) A marking method for marking to a marking a protective film of a laminated structure comprising a support film tensely supported by a ring frame, the protective film releasably laminated on the support film and a work fixed to the protective film, wherein the protective film is irradiated with laser light from a side of the support film, to thereby mark the protective film.

(2) A marking method for marking a protective film of a laminated structure comprising a support film tensely supported by a ring frame, the protective film forming layer releasably laminated on the support film and a work adhered to the protective film forming layer, wherein the protective film forming layer is cured to simultaneously form a protective film and firmly fix the protective film with the work to each other and, then, the protective film is irradiated with laser light from a side of the support film, to thereby mark the protective film.

(3) The marking method according to (2), wherein the curing of the protective film forming layer is performed by heating.

(4) The marking method according to any one of (1) to (3), wherein the marking is performed in a state in which a distance between an upper face of the support film and a bottom face of the protective film is 50 μm or less.

(5) The marking method according to any one of (1) to (4), wherein the marking is performed in a state in which the protective film is fixed on the support film either directly or via an adhesive layer only.

(6) A sheet for both protective film forming and dicing, comprising a sheet having on an upper face an approximately circular region comprising the protective film forming layer and an annular region comprising a removable adhesive material encircling the former region.

(7) The sheet for both protective film forming and dicing according to (6), comprising a support film, and an approximately circular protective film forming layer formed in a center portion of the support film and an annular removable adhesive material formed on the periphery of the support film.

(8) The sheet for both protective film forming and dicing according to (6), comprising a support film, and a removable adhesive material formed on the support film and an approximately circular protective film forming layer formed in a center portion of the removable adhesive material.

(9) The sheet for both protective film forming and dicing according to (6), comprising a support film, a protective film forming layer formed on the support film, and an annular removable adhesive material formed on the periphery of the protective film forming layer.

(10) The sheet for both protective film forming and dicing according to any one of (6) to (9), wherein the protective film forming layer comprises a thermosetting component and a binder polymer component.

According to the invention, in the process in which the marking is performed on the protective film formed on the work, the marking method in which the marking is performed on the protective film with a high accuracy by suppressing the warpage of the work and, also, the sheet for both protective film forming and dicing which is advantageously used in the method are provided.

DETAILED DESCRIPTION OF THE INVENTION

Figure 1:
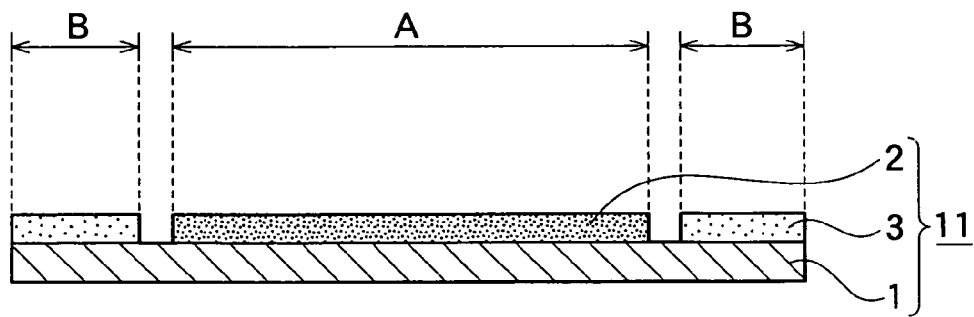
FIGS. 1 to 3 are cross-sectional views of sheets for both protective film forming and dicing according to the present invention.

A "work" according to the present invention is not particularly limited and is preferably, for example, a semiconductor wafer in which a circuit is formed on a surface. When it is the semiconductor wafer, a protective film is formed on a back surface of the wafer and marking of, for example, a product number is performed on the protective film.

A marking method according to the present invention is performed "in a state of laminated structure comprising a support film tensely supported by a ring frame, a protective film releasably laminated on the support film and a work fixed on the protective film". A method for generating the above-described state is not particularly limited and, although any arbitrary method is permissible, two methods can specifically be mentioned below.

A first method is a method in which a protective film forming layer of a sheet having a support film and a protective film forming layer formed on the support film is adhered to the work, an outer periphery of the support film is fixed on the ring frame and, then, the protective film forming layer is cured to form the protective film and, at the same time, the protective film is fixed to the work. The sheet to be used in this method is not particularly limited and the sheet for both protective film forming and dicing of the invention is favorably used.

A second method is a method in which the protective film forming layer is adhered to a one face of the work, the support film is adhered to the protective film forming layer, the outer periphery of the support film is fixed to the ring frame and, then, the protective film forming layer is cured to form the protective film and, at the same tine, the protective film is fixed to the work. In this method, in order to provide the protective film forming layer on one face of the work, the sheet for the protective film forming as described in JP-A No. 2002-280329 and, as for the support film, a general-use dicing sheet can be used.

In the first method, the sheet to be prepared may be single sheet for both the protective film forming and dicing. As for an adhering step, a step of adhering the sheet for both the protective film forming and dicing to the work may only be done. On the other hand, in the second method, it is necessary to prepare a sheet for protective film forming and a dicing sheet separately and, further, it is necessary to perform a step of adhering the protective film forming layer to the work and a step of adhering the protective film forming layer to the support film. Therefore, the first method which can be performed with smaller numbers of sheets and steps to be required is more preferable.

The sheet for both protective film forming layer and dicing according to the invention to be favorably used in the first method is "a sheet for both protective film forming and dicing, comprising a sheet having on an upper face an approximately circular region comprising the protective film forming layer and an annular region comprising a removable adhesive material encircling the former region".

The shape of the approximately circular region of the protective film forming layer is not particularly limited, so long as it corresponds to the shape of a face of the work to be applied and, for example, a circle can be mentioned. A size of the region is not particularly, so long as it covers a face of the work to be applied and, for example, the same size as or a slightly larger size than that of the face of the work can be mentioned. The protective film forming layer is cured by predetermined treatment such as heating or light irradiation and, then, firmly fixed to the work and, at the same time, becomes a protective film for protecting the work.

The annular region of the removable adhesive material is a site which is adhered to the ring frame for fixing the sheet. The shape and size of the annular region are not necessarily completely same as those of the ring frame and may be any shape and size, so long as they are such shape and size as can obtain a sufficient bonding force. The term "annular shape" as used herein denotes not only a circular ring but also all shapes in ring form such as an elliptic ring and a polygonal ring. Further, the ring may not be a perfect ring. Namely, it may have one or more discontinuous portions and, for example, it may have a "C-shape". More specific embodiments of such sheets for both protective film forming and dicing are shown in FIGS. 1 to 3.

A sheet 11 for both protective film forming and dicing as shown in FIG. 1 comprises a support film 1, an approximately circular protective film forming layer 2 formed in a center portion on the support film 1 and an annular removable adhesive material 3 formed in a periphery of the support film 1.

Figure 2:
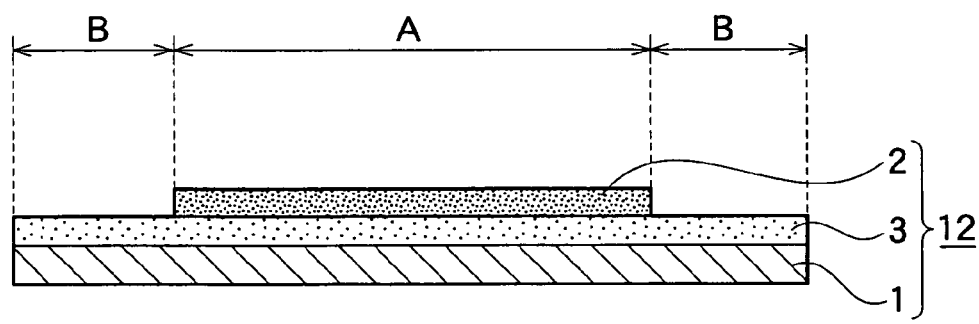

Another sheet 12 for both protective film forming and dicing as shown in FIG. 2 comprises the support film 1, the removable adhesive material 3 formed on the support film 1 and the approximately circular protective film forming layer 2 formed in a center portion on the removable adhesive material 3.

Figure 3:
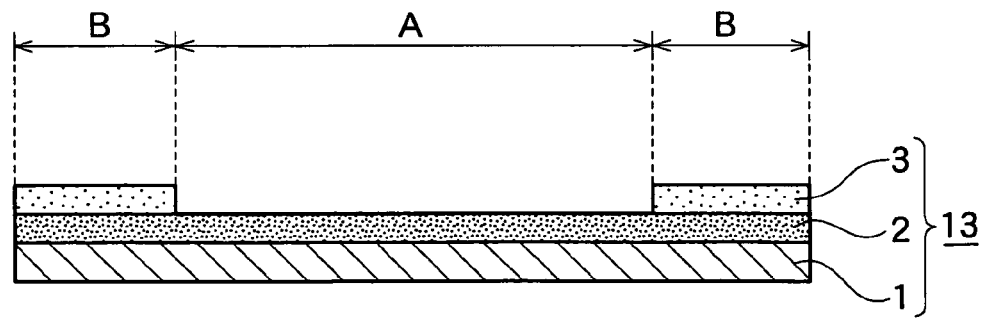

Still another sheet 13 for both protective film forming and dicing as shown in FIG. 3 comprises the support film 1, the protective film forming layer 2 formed on the support film 1 and an annular removable adhesive material 3 formed in an periphery on the protective film forming layer 2.

As is found from FIGS. 1 to 3, any one of the sheets 11 to 13 for both protective film forming and dicing contains on the upper surface an approximately circular region A of the protective film forming layer and an annular region B which encircles the region A and comprises the removable adhesive material. The shape and size of each sheet are sufficient so long as they satisfy the above-described requirements.

As for the support film 1, such support film as has a transparency for the wavelength of the laser to be used is employed such that printing can be performed on the protective film by laser marking. For example, a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate film, an ionomer-resin film, an ethylene/(meth) acrylic acid copolymer film, a polystyrene film, a polycarbonate film, a polyimide film, a fluorine resin film or a liquid crystal polymer film can be used. Further, any one of cross-linked films or modified films by radiation or discharge of these films can be used. A laminated film of the above-described films can be used as well.

Still further, as for the support film 1 in view of heat resistance, that having a high melting point is preferred. Specifically, that having a melting point of 150° C. or more is preferred and that having a melting point of 200° C. or more is more preferred. In a case that the melting point is less than 150° C., when the protective film forming layer 2 is heat-cured, the support film 1 is sometimes melted and, then, can not hold an original shape or may be fuse-bonded with an adjacent apparatus. Specifically, for example, a-polymethylpentene film, a polyethylene terephthalate film, a polyethylene naphthalate film, a polyimide film, a fluorine resin film, a liquid crystal polymer film are preferably used. Further, in a case that curing of the protective film forming layer 2 is performed by irradiating the energy ray, it is necessary that the support film 1 has a transparency for the energy ray.

In an embodiment as shown in FIG. 1 or 3, the support sheet 1 has a surface tension of an upper face of preferably 40 mN/m or less, more preferably 37 mN/m or less, particularly preferably 35 mN/m or less at 23° C. When the surface tension of the support film 1 is in the above-described ranges, the protective film to be formed by curing the protective film forming layer 2 and the support film 1 become releasable from each other and, then, transferring of the protective film to the work can smoothly be performed. On the other hand, in a case that the surface tension of the support film 1 is 40 mN/m or more, when the protective film is released from the support film 1, there likely cause a problem of zipping. The support film 1 having an upper face of such a low surface tension can be obtained by appropriately selecting a material thereof and, also, can be obtained by applying a release treatment such as a silicone treatment, an alkyd treatment or a fluorine treatment.

Further, in the embodiment as shown in FIG. 2, it is preferred that, after an upper face of the support film 1 is subjected to a corona treatment or the like, the removable adhesive material 3 is provided to enhance a bonding force between the support film 1 and the removable adhesive material 3. The protective film to be formed by curing the protective film forming layer 2 is in a state of being releasably laminated on the support film 1 via removable adhesive material 3. Namely, when the work, on which the protective film is firmly adhered, comes to be released, it is released at an interface between the protective film and the removable adhesive material 3 and, therefore, the protective film is transferred to the work.

Thickness of the support film 1 is preferably from 30 to 300 μm, more preferably from 50 to 200 μm and, still more preferably, from 75 to 150 μm. When the thickness thereof is 30 μm or less, there is a risk that the film is severed from a point of cutting made on the film at the time of dicing. When the thickness thereof is 300 μm or more, an extra thickness is economically useless and, since unevenness is large in thickness, it becomes difficult to focus the laser marking.

The protective film forming layer 2 comprises a curable component and a binder polymer component. As for the curable component, a thermosetting component, an energy ray-curable component or a combination of these components can be used. However, when heat resistance of the protective film forming layer 2 after cured is taken into consideration, it is particularly preferable to use the thermosetting component.

Examples of such thermosetting components include an epoxy resin, a phenol resin, a melamine resin, a urea resin, a polyester resin, a urethane resin, an acrylic resin, a polyimide resin, a benzoxazine resin and mixtures thereof. In the invention, any one of an epoxy resin, a phenol resin and mixtures thereof is preferably employed.

The epoxy resin can make a rigid coat with three dimensional network when heated. Various known epoxy resins have been conventionally used. Preferably, the epoxy resin has a molecular weight of around 300 to 2000. Particularly preferred is a blend of epoxy resins containing a liquid one in ordinary state, having a molecular weight of 300 to 500, preferably 330 to 400 and the solid one at ordinary temperature, having a molecular weight of 400 to 2500, preferably 500 to 2000. The epoxy resin preferably used in the invention has an epoxy equivalent of 50 to 5000 g/eq. Specific examples of such epoxy resins include glycidyl ethers of phenols, for example, bisphenol A, bisphenol F, resorcinol, phenol novolak and cresol novolak; glycidyl ethers of alcohols, for example, butanediol, polyethylene glycol and polypropylene glycol; glycidyl ethers of carboxylic acids, for example, phthalic acid, isophthalic acid and tetrahydrophthalic acid; epoxy resins of glycidyl- or alkyl glycidyl-types, for example, in which active hydrogen bonded to nitrogen of aniline isocyanurate or the like is substituted with a glycidyl group; and so-called alicyclic epoxides in which epoxy is introduced by oxidation of a C—C double bond in the molecule, for example, vinylcyclohexane diepoxide, 3,4-epoxycyclohexylmethyl-3,4-dicyclohexane carboxylate and 2-(3,4-epoxy)cyclohexyl-5,5-spiro (3,4-epoxy)cyclohexane-m-dioxane. Epoxy resins each having a biphenyl, dicyclohexadiene or naphthalene skeleton can also be employed.

Among these epoxy resins, epoxy resins of bisphenol-based glycidyl type, o-cresol novolak type or phenol novolak type are preferable according to the invention. These epoxy resins are used either individually or in combination. The epoxy resin, when employed, is preferably used together with an auxiliary, i.e., a heat-activatable latent epoxy resin curing agent.

The heat-activatable latent epoxy resin curing agent does not react with an epoxy resin at room temperature but reacts when activated under heating over a specific temperature.

To activate the heat-activatable latent epoxy resin curing agent, there are a method in which active species (anions, cations) are generated through the chemical reaction by heating, a method in which the agent, which has been stably dispersed in the epoxy resin at around room temperature, is incorporated with the resin to dissolve therein at high temperatures to initiate the curing reaction, a method in which the curing agent encapsulated in molecular sieve is eluted at high temperatures to initiate the curing reaction, and a method using a micro-capsule.

Specific examples of the heat-activatable latent epoxy resin curing agent for use in the invention include various onium salts and active hydrogen compounds of high melting point, for example, a dibasic acid dihydrazide compound, dicyandiamide, an amine adduct curing agent and an imidazole compound. These heat-activatable latent epoxy resin curing agents can be used either individually or in combination. The heat-activatable latent epoxy resin curing agent is used preferably at from 0.1 to 20 parts by weight, more preferably at from 0.2 to 10 parts by weight and, particularly preferably, at from 0.3 to 5 parts by weight per 100 parts by weight of the epoxy resin.

Condensation products of aldehydes and phenols, for example, an alkyl phenol, a polyphenol and naphthol, can be used as the phenol resin without limitations. Examples of phenol resins preferably used in the invention include a phenol novolak resin, an o-cresol novolak resin, a p-cresol novolak resin, a t-butyl phenol novolak resin, a dicyclopentadiene cresol resin, a poly paravinyl phenol resin and a bisphenol A type novolak resin, and modified resins thereof.

A phenolic hydroxyl group contained in any one of these phenol resin can readily occur addition reaction with an epoxy group in the epoxy resin when heated to form a cured product high in impact resistance. Accordingly, the epoxy resin and the phenol resin can be used together.

The energy ray-curable component is composed of a compound polymerizable/curable by irradiation of an energy ray, for example, an ultraviolet ray or an electron ray. The compound has at least one polymerizable double bond in the molecule and has, generally, a molecular weight of around 100 to 30000 and, preferably, around 300 to 10000. Specifically, examples thereof include trimethylol propane triacrylate, tetramethylol methane tetraacrylate, pentaerythritol triacrylate, dipentaerythritol monohydroxypentaacrylate, dipentaerythritol hexaacrylate, 1,4-butyleneglycol diacrylate, 1,6-hexanediol diacrylate, polyethyleneglycol diacrylate, oligoester acrylate, a urethane acrylate oligomer of a polyester or polyether type, a polyester acrylate, a polyether acrylate, and an epoxy-modified acrylate. Among these compounds, preferable for the present invention are ultraviolet ray-curable resins, specifically an oligoester acrylate and a urethane acrylate oligomer.

Incorporation of a photopolymerization initiator in the energy ray-curable component can shorten the polymerization/curing time and reduce the ray irradiation dose.

Examples of such photopolymerization initiators include benzophenone, acetophenone, benzoin, benzoin methyl ether, benzoin ethyl ether, benzoin isopropyl ether, benzoin isobutyl ether, benzoin benzoic acid, benzoin methyl benzoate, benzoin dimethyl ketal, 2,4-diethylthioxanthone, α-hydroxycyclohexylphenylketone, benzyldiphenylsulfide, tetramethylthiurammonosulfide, azobisisobutyronitrile, benzyl, dibenzyl, diacetyl, and β-chloroanthraquinone.

The photopolymerization initiator is suitably used at 1.5 to 4.5 parts by weight, preferably 2.4 to 3.8 parts by weight per 100 parts by weight of the energy ray-curable component.

The binder polymer component is employed for the purposes of imparting proper tackiness to the protective film forming layer 2 and improving operability of the sheet. The binder polymer has a weight average molecular weight of 50,000 to 2,000,000, preferably 100,000 to 1,500,000, particularly preferably 200,000 to 1,000,000. The sheet might not be formed adequately when the molecular weight of the binder polymer is too low, and not uniformly when too high because of poor mutual solubility of the polymer with other components. Usable binder polymers are, for example, an acrylic polymer, a polyester resin, a urethane resin, a silicone resin and a rubber type polymer. Among these polymers, an acrylic polymer is preferably used.

Examples of such acrylic polymers include (meth)acrylate copolymers containing constituent units derived from a (meth)acrylate monomer and those derived from a (meth)acrylic acid derivative. Preferably, the (meth)acrylate monomer is $C_{1-18}$ alkyl (meth)acrylate, for example, methyl(meth)acrylate, ethyl(meth)acrylate, propyl(meth)acrylate and butyl(meth)acrylate. Exemplary (meth)acrylic acid derivatives are (meth)acrylic acid, glycidyl(meth)acrylate and hydroxyethyl(meth)acrylate.

When a glycidyl group is introduced into the acrylic polymer by using glycidyl methacrylate or the like as a constitutional unit, compatibility with an epoxy resin working as the above-described thermosetting component is enhanced and a glass transition temperature (Tg) of the protective film forming layer after cured is raised, thereby improving the heat resistance. Introducing a hydroxyl group into the acrylic polymer by using, for example, hydroxyethyl acrylate facilitates controlling the adhesion and adhesion characteristics of the polymer toward the work.

When the acrylic polymer is used as a binder polymer, the acrylic polymer has a weight average molecular weight of preferably 100,000 or more and, particularly preferably, 150,000 to 1,000,000. The glass transition temperature of the acrylic polymer is usually 20° C. or below and, preferably, around −70 to 0° C. The polymer has tackiness at room temperature (23° C.).

When the thermosetting component alone is incorporated in the protective film forming layer 2 as a curing component, it is incorporated preferably at 50 to 1500 parts by weight, more preferably at 70 to 1000 parts by weight and, particularly preferably, 80 to 800 parts by weight per 100 parts by weight of the binder polymer component.

When the energy ray-curable component alone is incorporated in the protective film forming layer 2 as a curing component, it is incorporated preferably at 5 to 500 parts by weight, more preferably 10 to 200 parts by weight and, particularly preferably 20 to 150 parts by weight per 100 parts by weight of the binder polymer component.

When both of the thermosetting component and the energy ray-curable component are incorporated in the protective film forming layer 2 as curing components, they are incorporated preferably at 50 to 1500 parts by weight, more preferably 70 to 1000 parts by weight and, particularly preferably 80 to 800 parts by weight in total per 100 parts by weight of the binder polymer component. At the same time, a weight ratio of the thermosetting component to the energy ray-curable component (thermosetting component/energy ray-curable component) is preferably 55/45 to 97/3, more preferably 60/40 to 95/5 and, particularly preferably, 70/30 to 90/10.

Incorporation of the thermosetting component and/or the energy ray-curable component with the binder polymer component in the above-described weight ratios gives the protective film having a proper tackiness before curing which secures a stable application and gives the protective film an excellent hardness after curing.

Further, the protective film forming layer 2 may be blended with a filler. As for the filler, an inorganic filler such as silica, for example, crystalline silica, fused silica or synthetic silica; alumina; or glass balloon can be mentioned. By blending the inorganic filler into the protective film forming layer 2, a coefficient of thermal expansion of the layer after curing can be brought close to that of the wafer, to thereby reduce the extent of the warpage of the wafer in working. As for the filler, the synthetic silica is preferred. Particularly, the synthetic silica of a type in which an irradiation source of an α ray that causes a malfunction of a semiconductor apparatus is reduced as much as possible is optimal. As for a shape of the filler, any type of a spherical shape, a needle-like shape and an amorphous type can be used and, particularly, the filler of spherical shape which can be most densely packed is preferred.

As for fillers to be blended into the protective film forming layer 2, functional fillers described below may be incorporated thereinto, in addition to the above-described inorganic fillers. For example, electrically conductive fillers such as gold, silver, copper, nickel, aluminum, stainless steel, carbon, silver-coated ceramic, silver-coated nickel and silver-coated aluminum may be added for the purpose of imparting electrical conductivity after die bonding. Thermal conductive substances such as metallic materials, for example, gold, silver, copper, nickel, aluminum, stainless steel, silicon and germanium, and alloys thereof, may be added for the purpose of imparting thermal conductivity.

Further, as for the filler to be incorporated into the protective film forming layer 2, a coupling agent may be added in the protective film forming layer 2 to improve adhesive properties and adhesion between the cured protective film and the work. The coupling agent improves the adhesive properties, the adhesion and water resistance (moist heat resistance) of the protective film without deteriorating heat resistance thereof. As for the coupling agent, a silane type (silane coupling agent) is preferred in view of versatility and costwise merits.

An amount of the filler to be incorporated in the protective film forming layer 2 varies depending on types of fillers but is usually 40 to 90% by weight, preferably 50 to 85% by weight on the basis of the weight of all components forming the protective film forming layer 2. By allowing the filler in the protective film forming layer 2 to have such ratio as described above, an elastic modulus (at 23° C.), gloss, total light transmittance of the cured film (protective film) can be adjusted. By increasing the amount of the filler, the elastic modulus (at 23° C.) of the cured film can be increased, to thereby impart a protection function for the work. On the other hand, the gloss and the total light transmittance are reduced, to enhance an extent of the recognition of the mark inscribed on the surface of the protective film by laser. Further, the coefficient of the thermal expansion of the cured protective film can be brought close to that of the wafer. By such treatment as described above, an extent of the warpage of the wafer undesirably generated during working due to a difference in the coefficient of the thermal expansion between the protective film and the wafer can be reduced. When the warpage of the wafer is generated, the wafer tends to be broken and, also, it becomes difficult to easily transport the wafer.

By adding a pigment or dye, the elastic modulus of the cured film (protective film) can be controlled to some extent but the pigment or the dye is mainly added for the purpose of enhancing the recognition property of the print to be formed on the surface of the cured film (protective film). Examples of such pigments include carbon black, various types of inorganic pigments and various types of organic pigments such as those of an azo type, an indanthrene type, an indophenol type, a phthalocyanine type, an indigoido type, a nitroso type, a zanthene type and an oxyketone type.

An amount of the pigment or dye to be added varies depending on the type thereof but is usually 0.1 to 20% by weight and, preferably, 0.2 to 15% by weight.

In order to adjust a cohesive force of the protective film forming layer 2 before curing, a cross-linking agent such as an organic polyvalent isocyanate compound, an organic polyvalent imine compound or an organometallic chelating agent can be added to the protective film forming layer 2.

The protective film forming layer 2 may be colored. Coloration for the protective film forming layer 2 can be made by incorporating a pigment, a dye or the like therein. The resultant colored protective film forming layer 2 improves appearance of the resulting chips.

An antistatic agent may be incorporated in the protective film forming layer 2. Such incorporation of the antistatic agent suppresses static electricity occurrence, to thereby improve the chip reliability. Further, a phosphoric acid compound, a bromine compound or a phosphorus compound can be incorporated in the protective film forming layer 2, to thereby impart flame resistance. The resultant protective film improves reliability of the manufactured IC package.

When the above-described filler, pigment or dye is incorporated in the protective film forming layer 2, a clear print can be formed on the cured film (protective film) by the laser marking or the like. Namely, in these cases, a sufficient contrast difference between a print portion and a non-print portion can be obtained, to thereby enhance the recognition property of the print.

The protective film forming layer 2 thus formed has a thickness of preferably 3 to 100 μm, more preferably 10 to 60 μm. The storage modulus (at 23° C.) of the cured protective film forming layer 2 is preferably 100 to 100,000 MPa and more preferably 1000 to 10,000 MPa.

As for the removable adhesive material 3, no particular restriction is put thereon, so long as no adhesive remains on ring frame after releasing therefrom. Specifically, an adhesion force of an upper face of the removable adhesive material 3 to an SUS plate is preferably 20 N/20 mm or less, more preferably 10 N/20 mm or less and, particularly preferably 5 N/20 mm or less. In a case in which the adhesion force is larger than 20 N/20 mm, when the removable adhesive material 3 is released from the ring frame, the adhesive may sometimes remain and taint the ring frame.

When the protective film forming layer 2 is cured by heating, the removable adhesive material 3 should be thermally resistant. Further, it is preferable that the adhesion force of the upper face of the removable adhesive material 3 after heating for 2 hours at 130° C. has the above-described value. As for such removable adhesive material as having the above-described thermal resistance, the adhesive of acrylic type or silicone type is preferable.

As for layer constitution of the removable adhesive material 3, specifically, three types of constitutions can be mentioned as follows:

a single-layer constitution of the removable adhesive layer alone (adhesive double-coated sheet without carrier);

a dual-layer constitution in which the removable adhesive layer is laminated on an upper face of a resin film; and a triple-layer constitution in which the removable adhesive layer is laminated on the upper face of the resin film (carrier) and an adhesive layer is laminated on a bottom face thereof. As for the resin film, materials used in the above-described support film 1 can be used. As for the adhesive layer on the bottom face side of the triple-layer constitution, an arbitrary adhesive layer which has a same or higher adhesion force as that of the removable adhesive layer on the upper face side thereof can be used.

The removable adhesive material 3 in the sheets 11, 12 for both protective film forming and dicing is a single layer or triple layers. The removable adhesive material 3 in the sheet 13 for both protective film forming and dicing is any of a single layer, dual layers and triple layers. When the removable adhesive material 3 in the sheet 13 for both protective film forming and dicing is double layers, the bottom face (resin film face) of the removable adhesive material 3 is fixed on the upper face of the protective film forming layer 2 by the adhesion force of the upper face of the protective film forming layer 2.

In a case of such constitution as in the sheet 12 for both protective film forming and dicing in which the protective film forming layer 2 is laminated on the removable adhesive material 3, a release film having a releasable upper face is provided between the removable adhesive material 3 and the protective film forming layer 2, to thereby enhance the releasing property of the protective film. As for the release film, those illustrated in the support film 1 can be used.

As for a method for producing the sheet 11 for both protective film forming and dicing, the following method can be mentioned:

Firstly, a release film is released from a sheet having a constitution of support film 1/protective film forming layer 2/release film, the protective film forming layer 2 is die-cut to be in a circular shape having a size same as or one size larger than that of the wafer as shown in FIG. 1 without cutting the support film 1 and, then, offscouring on an outer peripheral portion thereof is removed. Separately, a sheet having a constitution of release film/removable adhesive material 3/release film is prepared, one release film is released therefrom, the resultant sheet is die-cut to be in a shape corresponding to that of an inner portion of an overlap width and, then, a central portion is removed. After both resultant sheets are concentrically bonded to each other, the support film 1 and the removable adhesive material 3 are die-cut to be in a shape corresponding to that of an outer diameter of the overlap width to the ring frame and, then, an outer peripheral portion is removed, to thereby obtain a sheet having a targeted constitution.

As for a method for producing the sheet 12 for both protective film forming and dicing, the following method can be mentioned:

Firstly, a release film is released from a sheet having a constitution of release film/protective film forming layer 2/release film, the protective film forming layer 2 is die-cut to be in a circular shape having a size same as or one size larger than that of the wafer as shown in FIG. 2 and, then, offscouring on an outer peripheral portion thereof is removed. The resultant sheet is adhered to a removable adhesive material 3 of a support film 1 having the removable adhesive material 3 which has separately been prepared and, thereafter, concentrically die-cut to be in a shape corresponding to that of an outer diameter of the overlap width to the ring frame and, subsequently, an outer peripheral portion is removed, to thereby obtain a sheet having a targeted constitution. In the constitution of FIG. 2, the support film having the removable adhesive material 3 is integrally formed and its periphery portion (i.e., the annularly exposed portion of the removable adhesive material 3) corresponds to the removable adhesive material 3 in the constitutions shown in FIGS. 1 and 3.

As for a method for producing the sheet 13 for both protective film forming and dicing, the following method can be mentioned:

Firstly, a sheet having a constitution of release film/removable adhesive material 3/release film is prepared and, then, a release film is released therefrom and, thereafter, the resultant sheet is die-cut to be in a shape corresponding to that of an inner portion of an overlap width for being adhered to a ring frame and, subsequently, a central portion is removed. After the resultant sheet is concentrically bonded to a sheet having a constitution of support film 1/protective film forming layer 2, the thus-bonded sheets are die-cut to be in a shape corresponding to that of an outer diameter of the overlap width against the ring frame and, then, an outer peripheral portion is removed, to thereby obtain a sheet having a targeted constitution.

Hereinafter, a marking method according to the invention is described with reference to drawings taking an embodiment where the sheet 11 (shown in FIG. 1) for both protective film forming and dicing is used and a wafer having circuits thereon is used as a work.

Figure 4:
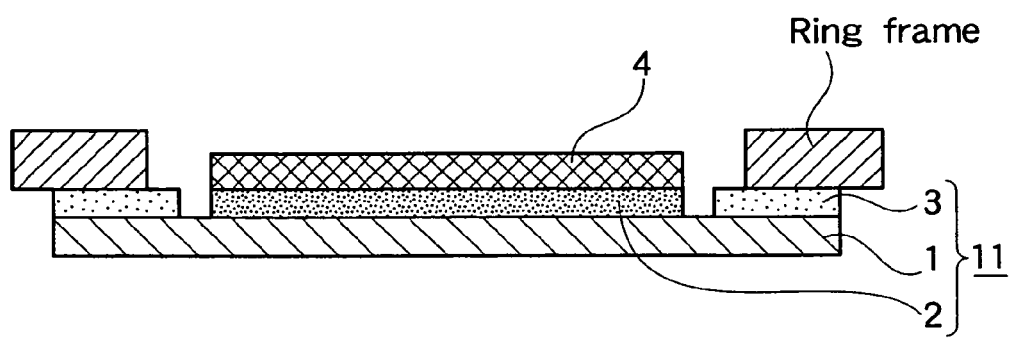
FIG. 4 shows a state in which a wafer is fixed by using the sheet for both protective film forming and dicing according to the present invention.

FIG. 4 shows a state in which a protective film 2 is releasably laminated on a support film 1, a wafer 4 is firmly fixed on the protective film 2 and an outer periphery of the support film 1 is fixed to a ring frame via a removable adhesive material 3. Such a laminate state can be realized via steps as described above.

Figure 5:
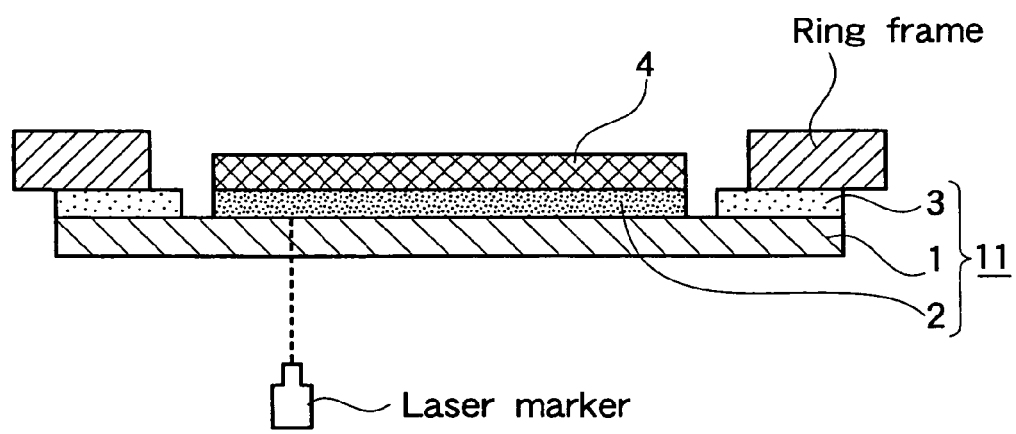
FIG. 5 shows a state in which marking is performed by using any one of sheets for both protective film forming and dicing according to the present invention.

In the marking method according to the invention, under the above-described state, a product number or the like is marked (shown in FIG. 5) on the protective film 2 by inscribing a bottom face of the protective film 2 by irradiating laser light from the side of the support film 1, namely, from the bottom side of the sheet 11 for both protective film forming and dicing. Further, such marking is formed on the protective film 2 positioned at a rear side corresponding to each circuit pattern on the surface of the wafer 4.

Even when a warpage is present on the wafer or the warpage is generated on the wafer at the time of applying the sheet 11 for both protective film forming and dicing, since the wafer is supported by the support film 1 which is fixed to the ring frame by the periphery, the warpage is straightened and, then, the wafer is held in a flat manner. Therefore, the laser light is precisely focused, to thereby perform the marking with a high accuracy.

A distance between the upper face of the support film 1 and the bottom face of the protective film 2 is preferably 50 μm or less, more preferably 30 μm or less, still more preferably 15 μm or less and, particularly preferably, 0 μm. When the distance between the upper face of the support film 1 and the bottom face of the protective film 2 is shorter, the accuracy of the laser marking is enhanced. The distance is 0 μm in an embodiment as shown in FIG. 4 and it is also 0 μm in a case in which the sheet 13 (shown in FIG. 3) for both protective film forming and dicing is used. When the sheet 12 (shown in FIG. 2) for both protective film forming and dicing is used, thickness of the removable adhesive material 3 corresponds to the above-described distance.

As for a state in which the protective film is laminated on the support film, it is preferable that the protective film is laminated on the support film either directly or via an adhesive layer alone. When the sheets 11 (shown in FIG. 1), 13 (shown in FIG. 3) for both protective film forming and dicing are used, a state in which the protective film forming layer is laminated directly on the support film can be prepared. When the sheet 12 for both protective film forming and dicing is used, a state in which the protective film forming layer is laminated on the support film via the removable adhesive layer alone can be prepared.

The above-described laminate satisfying the relation pertinent to the distance between the above-described support film and the protective film, realizes the marking with a high accuracy, since refraction and scattering of irradiated laser light between the support film and the protective film at the time of marking can be prevented.

The protective film can be formed by curing the protective film forming layer. When the protective film forming layer contains a thermosetting component as a curable component, the protective film forming layer is heated. When the protective film forming layer contains an energy ray-curable component as a curable component, the protective film forming layer is irradiated by the energy ray. As for the timing of curing the protective film forming layer, it is preferable to cure the protective film forming layer before performing the marking.

When the protective film forming layer is cured (particularly by heating), it sometimes shrinks at the same time. Such shrinkage of the protective film forming layer causes the warpage of the wafer but, according to the invention, since the wafer is held on the support film in which the outer periphery is fixed to the ring frame, even when the protective film forming layer is subjected to heat-curing, the wafer does not warp by the shrinkage and, then, can hold a flat state. Therefore, even after the curing of the protective film forming layer, the marking can be performed with a high accuracy.

Figure 6:
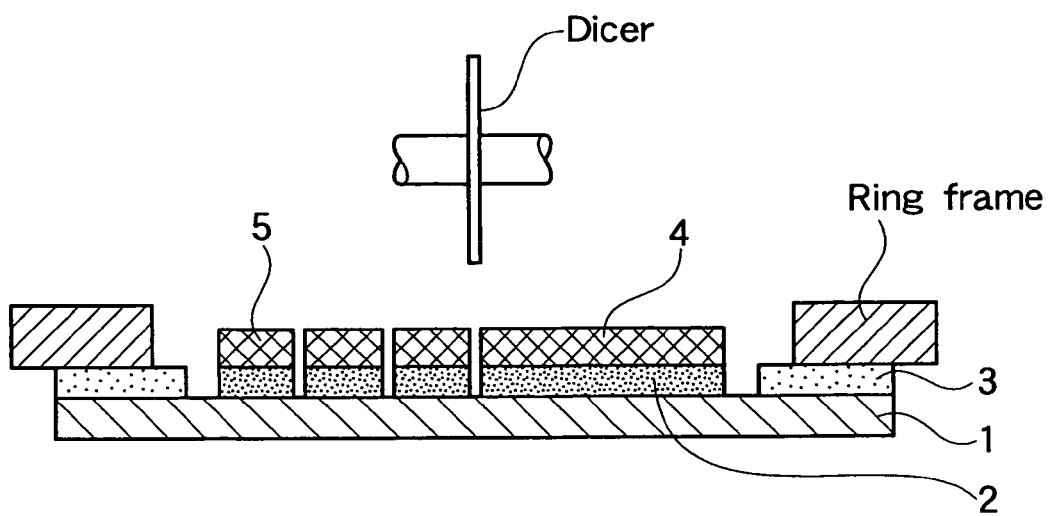
FIG. 6 shows a state in which dicing is performed by using any one of sheets for both protective film forming and dicing according to the present invention.
Figure 7:
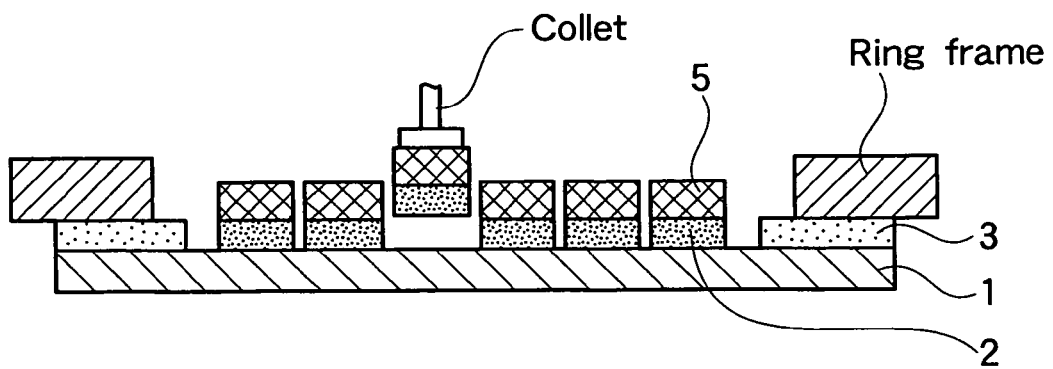
FIG. 7 shows a state in which pick-up is performed by using any one of sheets for both protective film forming and dicing according to the present invention.

Further, as shown in FIG. 6, the wafer 4 can be subjected to dicing, to thereby obtain a semiconductor chip 5. The dicing is performed such that the wafer 4 and the protective film 2 are simultaneously cut. Thereafter, each chip 5 is picked up by a generally-used device such as collet, to thereby obtain the semiconductor chip (shown in FIG. 7) having the protective film in which the marking is performed on a rear face.

The timing of performing the dicing is not particularly limited and may be either before or after the marking.

A sequence of the above-described curing step, marking step and dicing step is not defined and these steps can be performed in an arbitrary sequence. However, it is preferable that the curing step, the marking step and the dicing step are performed in this order. Further, another step can be performed between any two of the above-described steps. In any step, since the wafer is maintained flat without warpage, all operations such as respective process operations, transfer between steps, transportation and storage can be performed in an efficient smooth manner.

When the above-described processes are performed by using the sheet for both protective film forming and dicing according to the invention, since the removable adhesive material is adhered to the ring frame, no adhesive remains on the ring frame at the time the sheet is released from the ring frame after the above-described processes are terminated.

According to the invention, in the process in which the marking is performed on the protective film formed on the work, the marking method in which the marking is performed on the protective film with a high accuracy by suppressing the warpage of the work and, also, the sheet for both protective film forming and dicing which is advantageously used in the method are provided.

EXAMPLES

The present invention is described in detail with reference to the examples, which are not to limit the scopes of the invention in any way. The composition of the protective film forming layer, the wafer and the apparatuses used in the examples are shown below.

(Adhesive for Removable Adhesive Material)

As for the adhesive for the removable adhesive material, compositions as described below were prepared. Adhesive "A" consisting of:

6.5 parts by weight (in terms of solid content) of organic polyvalent isocyanate cross-linking agent (trade name: Coronate L; available from Nippon Polyurethane Industry Co. Ltd.) per 100 parts by weight of acrylic adhesive (a copolymer with a weight average molecular weight of 800000 prepared by copolymerizing 25 parts by weight of 2-hydroxyethyl acrylate, 40 parts by weight of butyl acrylate, 30 parts by weight of vinyl acetate, 3 parts by weight of 4-hydroxybutyl acrylate and 0.5 part by weight of acrylic acid)

Adhesive "B" Consisting of:

Silicone Adhesive of 60 parts by weight of KS847H (available from Shin-Etsu Chemical Co., Ltd.), 30 parts by weight of SD4584 (available from Dow Corning Toray Co., Ltd.), and 0.5 part by weight of SRX212 (available from Dow Corning Toray Co., Ltd.).

(Protective Film Forming Layer)

A composition for a protective film forming layer as was prepared by blending:

100 parts by weight of a binder polymer composed of an acrylic polymer (a copolymer obtained by copolymerizing 55 parts by weight of butyl acrylate, 15 parts by weight of methyl methacrylate, 20 parts by weight of glycidyl methacrylate and 15 parts by weight of 2-hydroxyethyl acrylate, and having a weight average molecular weight of 900,000 and a glass transition temperature of −28° C.), 100 parts by weight of a thermosetting component composed of a mixed epoxy resin (60 parts by weight of a liquid epoxy-bisphenol A resin (molecular weight: about 370; epoxy equivalent: 180 to 200 g/eq), 10 parts by weight of a solid epoxy-bisphenol A resin (molecular weight: about 1600; epoxy equivalent: 800 to 900 g/eq) and 30 parts by weight of an epoxy-o-cresol novolak resin (molecular weight: about 1500 to 1800; epoxy equivalent: 210 to 230 g/eq), a heat-activatable latent epoxy resin curing agent (dicyandiamide: 2.4 parts by weight; and 2-phenyl-4,5-dihydroxymethyl imidazole (trade name: 2PHZ; available from Shikoku Chemicals Corporation): 2.4 parts by weight), 10 parts by weight of carbon black (average particle diameter: 28 nm), and 288 parts by weight of fused quartz filler (average particle diameter: 8 μm), 32 parts by weight of synthetic silica filler (average particle diameter: 0.5 μm) and a diluent solvent.

(Support Film)

Support films as described below were prepared, respectively.

Support Film "A"

A film (surface tension: less than 30 mN/m) which is obtained by coating on one face of a polyethylene naphthalate (PEN) film (thickness: 75 μm) with a silicone-type releasing agent [comprising 100 parts by weight of KS-774 (trade name: available from Shin-Etsu Chemical Co., Ltd.) and 1 part by weight of CAT-PL-50T (trade name: available from Shin-Etsu Chemical Co., Ltd.)] and drying the coat came to be dry thickness of about 0.1 μm.

Support Film "B"

The PEN film (thickness: 100 μm) was allowed to be a support film "B". Further, a corona treatment was performed on one face of the PEN film and, then, the adhesive B was applied on the thus-treated face such that a film thickness after dried came to be 10 µm and dried and, thereafter, in order to protect the adhesive face, a release film for silicone adhesive (trade name: SP-PET38YSD, available from Lintec Co., Ltd.) was laminated thereon, to thereby produce a support film having a removable adhesive material.
Support Film "C"

A film (surface tension: less than 30 mN/m) in which a same silicone-type releasing agent as in the support film A was applied on one face of a polyethylene terephthalate (PET) film (thickness: 100 µm) and, then, dried.
(Wafer)

An unground silicon wafer having a diameter of 6 inches was ground to a thickness of 150 µm by using a grinding apparatus (trade name: DFG-840; available from Disco Co.) at #2000 abrasion to prepare the wafer for the examples.
(Sheet Mounting Apparatus)

As an apparatus for mounting the sheet for both protective film forming and dicing to the wafer, Adwill RAD2500 m/8 (available from Lintec. Co., Ltd.) was used.
(Laser Marking Apparatus)

LD-YAG Laser Marker MD-Y9710 (available from Keyence Corporation) was used.
(Dicing Apparatus)

AWD-4000B (available from Tokyo Seimitsu Co., Ltd.) was used.

Example 1

A sheet for both protective film forming and dicing having a constitution as shown in FIG. 1 was prepared in a manner as described below.

A composition for a protective film forming layer was coated on one face of the support film "A" on which a release treatment was performed such that a thickness thereof after removal of a solvent being 50 µm and, then, dried and, thereafter, a release film (trade name: SP-PET 3811; available from Lintec Corporation) was laminated on the face of the protective film forming layer, to obtain a protective film forming layer having a support film.

The adhesive "A" was coated on one face of a PET film (thickness: 25 µm) such that a thickness after removal of a solvent being 10 µm and, then, dried and, thereafter, a release film (trade name: SP-PET3811) was laminated on the face of the adhesive "A". Further, the adhesive B was coated on the opposite face of the PET film so that the thickness after the removal of the solvent is 10 µm and dried, a release film (trade name: SP-PET38YSD) was laminated on the face of the adhesive "B", to prepare a double-faced adhesive sheet having the PET film as a carrier which was, then, used as a removable adhesive material.

The protective film forming layer having the support film was subjected to die-cut so that the protective film forming layer and the release film were cut to be in a circular shape having a diameter of 160 mm without cutting the support film, then, an outer peripheral portion of the circular shape was removed. Further, all layers of the removable adhesive material was cut to be in a circular shape having a diameter of 165 mm and circular portions were removed. The release film of the adhesive B was released from the removable adhesive material and, then, adhered onto the protective film forming layer having the support film in a concentric manner (on a release face of the support film "A"). Subsequently, by cutting all layers of the support film and the removable adhesive material in a manner of concentric circle having a diameter of 207 mm, the sheet for protective film forming and dicing having a constitution as shown in FIG. 1 was prepared.

The protective film forming layer of the above sheet was adhered to a polished face of the wafer and, then, an outer periphery thereof was adhered to the ring frame and fixed thereto. The resultant article was heat-cured for 2 hours at 130° C., to thereby change the protective film forming layer into the protective film. Thereafter, laser marking was performed on the protective film to inscribe "ABC" (character sizes: 1 mm×1 mm) thereon from the side of the support film by using a laser marking apparatus under conditions of LD current 35A, 2000 mm/sec and 50 KHz. Subsequently, the wafer with the protective film was subjected to dicing, to thereby obtain chips each having sizes of 5 mm×5 mm. Then, the chips attached with the protective films were picked up by using a die-bonder and, thereafter, a remaining portion of the sheet for both protective film forming and dicing was released from the ring frame.

Example 2

A sheet for both protective film forming and dicing having a constitution as shown in FIG. 2 was prepared by a method as described below.

A composition for the protective film forming layer was coated on a release face of a release film (SP-PET3811) such that a thickness after removal of a solvent being 50 µm and, then, dried and, then, another release film (trade name: SP-PET3801; available from Lintec Corporation) was laminated on an exposed face of the protective film forming layer.

All layers of the protective film forming layer in which the release film was laminated on each face were cut to be in a size having a diameter of 165 mm, to thereby obtain the protective film forming layer in a circular shape. The release film on the support film B having a removable adhesive material and the release film on one face of the protective film forming layer were released therefrom and, then, the thus-exposed adhesive face and protective film forming layer were laminated one on top of the other. Subsequently, the resultant laminate was cut in a shape of concentric having a diameter of 207 mm, to thereby obtain a sheet for both protective film forming and dicing having a constitution as shown in FIG. 2.

Further, adhering to the wafer, heat-curing of the protective film forming layer, laser marking, dicing, pick-ups, and release from the ring frame were performed in a same manner as in Example 1.

Example 3

A sheet for both protective film forming and dicing having a constitution as shown in FIG. 3 was prepared by a method as described below.

A composition for the protective film forming layer was coated on a release-treated face of a support film "C" such that a thickness after removal of a solvent being 50 µm and, then, dried and, then, a release film (SP-PET3811) was laminated on a face of the protective film forming layer, to thereby obtain a protective film forming layer having a support film.

The adhesive "A" was applied on a release face of the release film (SP-PET3811) such that a thickness after removal of a solvent being 20 µm and, then, dried and, thereafter, another release film (SP-PET3801) was laminated on the exposed adhesive face. The resultant laminate was allowed to be a double-face adhesive sheet without carrier which was, then, used as a removable adhesive material. The removable adhesive material was die-cut to be in a size having a diameter of 165 mm such that the release film on one side of the removable adhesive material remained and, then, a circular portion was removed. The release film on the protective film forming layer having a support film and the release film on the die-cut side of the double-faced adhesive sheet were released and, then, the thus-exposed adhesive face and protective film forming layer were laminated one on top of the other. Subsequently, the resultant laminate was cut in a shape of concentric having a diameter of 207 mm, to thereby obtain a sheet for both protective film forming and dicing having a constitution as shown in FIG. 3.

Further, adhering to the wafer, heat-curing of the protective film forming layer, laser marking, dicing, pick-ups, and release from the ring frame were performed in a same manner as in Example 1.

Example 4

In a same manner as in Example 2, a protective film forming layer having a release film laminated on each face thereof and a support film B having a removable adhesive material were prepared.

The release film on one side of the protective film forming layer was released and, then, the resultant exposed protective film forming layer was adhered to a polished face of the wafer. The thus-adhered protective film forming layer and the release film were cut along the outer periphery of the wafer and, then, the release film on the protective film forming layer was released. Further, the support film having the removable adhesive material was cut to be in a size having a diameter of 207 mm and, then, the release film on the removable adhesive material was released and, thereafter, the support film was adhered to the protective film forming layer via the exposed adhesive face and, at the same time, an outer periphery thereof was attached to the ring frame and fixed thereto.

Further, adhering to the wafer, heat-curing of the protective film forming layer, laser marking, dicing, pick-ups, and release from the ring frame were performed in a same manner as in Example 1.

Example 5

Same operation as in Example 4 was conducted except that, after the protective film forming layer was attached to the wafer, the release film on the protective film forming layer was not released and the sheet for both protective film forming and dicing having a constitution of support film B/removable adhesive material/release film/protective film forming layer was used.

Comparative Example 1

Same operation as in Example 4 was conducted except that, before the support film B having the removable adhesive material was attached onto a face of the protective film forming layer, the protective film forming layer was heat-cured and, then, laser marking was performed.

Comparative Example 2

Same operation as in Example 3 was conducted except that the removable adhesive material was not used and the protective film forming layer was attached directly to the ring frame.

Evaluation Method (Warpage of Wafer)

After the sheet for both protective film forming and dicing was heat-cured, it was left at rest on a flat table with a wafer face facing the top of the table and, then, heights of a center and an edge of the wafer were measured and a difference therebetween was defined as a value of a warpage. Further, when such measurements were performed, in Examples 1 to 4 and Comparative Example 2, the wafer was in a state of being fixed on the sheet supported by the ring frame, while, in Comparative Example 1, the wafer was in a state of being left at rest on the table.

(Printing Property)

A chip after being picked up was visually observed and, when a character does not have a defect or an insufficient density, the chip was judged as being "favorable".

TABLE 1

|  | Example 1 | Example 2 | Example 3 | Example 4 | Example 5 | Comparative Example 1 | Comparative Example 2 |
|---|---|---|---|---|---|---|---|
| Warpage of wafer | 0 mm | 0 mm | 0 mm | 0 mm | 0 mm | 4 mm | 0 mm |
| Printing property | Favorable on entire face | Favorable on entire face | Favorable on entire face | Favorable on entire face | Favorable on entire face | Poor on edge portion | Favorable on entire face |
| Adhesive remaining on ring frame | Absence | Absence | Absence | Absence | Absence | Absence | Adhesive deposit on entire face |
| Pick-up property | Favorable | Favorable | Favorable | Favorable | Favorable | Favorable | Favorable |

What is claimed is:

1. A marking method for marking a protective film of a laminated structure comprising a support film tensely supported by a ring frame, the protective film forming layer releasably laminated on the support film and a work adhered to the protective film forming layer, wherein the protective film forming layer is cured to simultaneously form a protective film and firmly fixing the protective film with the work to each other and, then, the protective film is irradiated with laser light from a side of the support film, to thereby mark the protective film.

2. The marking method according to claim 1, wherein the curing of the protective film forming layer is performed by heating.

3. The marking method according to claim 1, wherein the marking is performed in a state in which a distance between an upper face of the support film and a bottom face of the protective film is 50 μm or less.

4. The marking method according to claim 2, wherein the marking is performed in a state in which a distance between an upper face of the support film and a bottom face of the protective film is 50 μm or less.

5. The marking method according to claim 1, wherein the marking is performed in a state in which the protective film is fixed on the support film either directly or via an adhesive layer only.

6. The marking method according to claim 2, wherein the marking is performed in a state in which the protective film is fixed on the support film either directly or via an adhesive layer only.

7. The marking method according to claim 1, wherein the work is a semiconductor wafer.

8. The marking method according to claim 1, wherein the protective film forming layer comprises a filler.

9. The marking method according to claim 1, wherein the protective film forming layer is colored.

10. The marking method according to claim 8, wherein the amount of filler is 40 to 90% by weight on the basis of the weight of all components forming the protective film forming layer.

11. The marking method according to claim 9, wherein the protective film forming layer has a black color.

12. The marking method according to claim 1, wherein the work is a semiconductor wafer and the protective film is formed on a back surface of the wafer.

* * * * *